(12) United States Patent
Pellizzer et al.

(10) Patent No.: US 9,111,857 B2
(45) Date of Patent: Aug. 18, 2015

(54) METHOD, SYSTEM AND DEVICE FOR RECESSED CONTACT IN MEMORY ARRAY

(71) Applicant: MICRON TECHNOLOGY, INC., Boise, ID (US)

(72) Inventors: Fabio Pellizzer, Cornate D'Adda (IT); Antonino Rigano, Pioltello (IT); Marcello Mariani, Milan (IT); Augusto Benvenuti, Lallio (IT)

(73) Assignee: MICRON TECHNOLOGY, INC., Boise, ID (US)

( * ) Notice: Subject to any disclaimer, the term of this patent is extended or adjusted under 35 U.S.C. 154(b) by 323 days.

(21) Appl. No.: 13/624,627

(22) Filed: Sep. 21, 2012

(65) Prior Publication Data
US 2014/0085973 A1 Mar. 27, 2014

(51) Int. Cl.
| | |
|---|---|
| *G11C 11/00* | (2006.01) |
| *H01L 27/24* | (2006.01) |
| *H01L 21/762* | (2006.01) |
| *H01L 45/00* | (2006.01) |
| *G11C 13/00* | (2006.01) |
| *H01L 21/308* | (2006.01) |

(52) U.S. Cl.
CPC .......... *H01L 27/2445* (2013.01); *H01L 21/762* (2013.01); *H01L 45/06* (2013.01); *H01L 45/1233* (2013.01); *G11C 13/0004* (2013.01); *H01L 21/3086* (2013.01); *H01L 27/2463* (2013.01); *H01L 45/1675* (2013.01)

(58) Field of Classification Search
CPC ........... G11C 13/0004; G11C 13/0069; G11C 11/5678
USPC ................................ 365/163, 148, 230.06, 63
See application file for complete search history.

(56) References Cited

U.S. PATENT DOCUMENTS

| | | | |
|---|---|---|---|
| 6,133,096 A * | 10/2000 | Su et al. ......................... 438/264 |
| 7,737,039 B2 | 6/2010 | Sandhu et al. | |
| 7,829,262 B2 | 11/2010 | Tran | |
| 7,863,173 B2 | 1/2011 | Kang et al. | |
| 7,873,935 B2 | 1/2011 | Jung et al. | |
| 7,972,959 B2 | 7/2011 | Mebarki et al. | |
| 8,654,584 B2 * | 2/2014 | Kim et al. ................. 365/185.17 |
| 2003/0199169 A1 | 10/2003 | Jun et al. | |
| 2009/0179187 A1 | 7/2009 | Liu et al. | |
| 2010/0054030 A1 | 3/2010 | Lowrey | |
| 2010/0232200 A1 | 9/2010 | Shepard | |
| 2011/0014574 A1 | 1/2011 | Tran | |
| 2011/0059403 A1 | 3/2011 | Sukekawa | |

* cited by examiner

*Primary Examiner* — Son Dinh
(74) *Attorney, Agent, or Firm* — Knobbe, Martens, Olson & Bear LLP

(57) ABSTRACT

Embodiments disclosed herein may relate to forming a contact region for an interconnect between a selector transistor and a word-line electrode in a memory device.

12 Claims, 15 Drawing Sheets

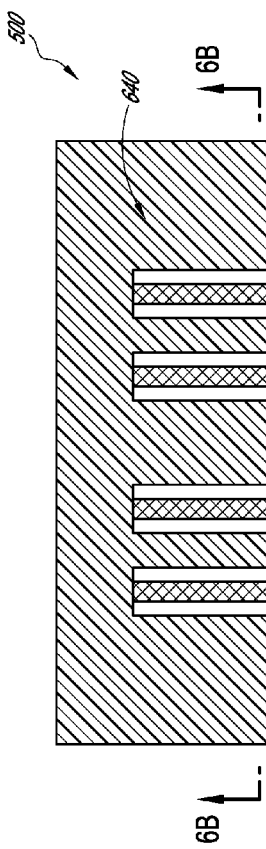
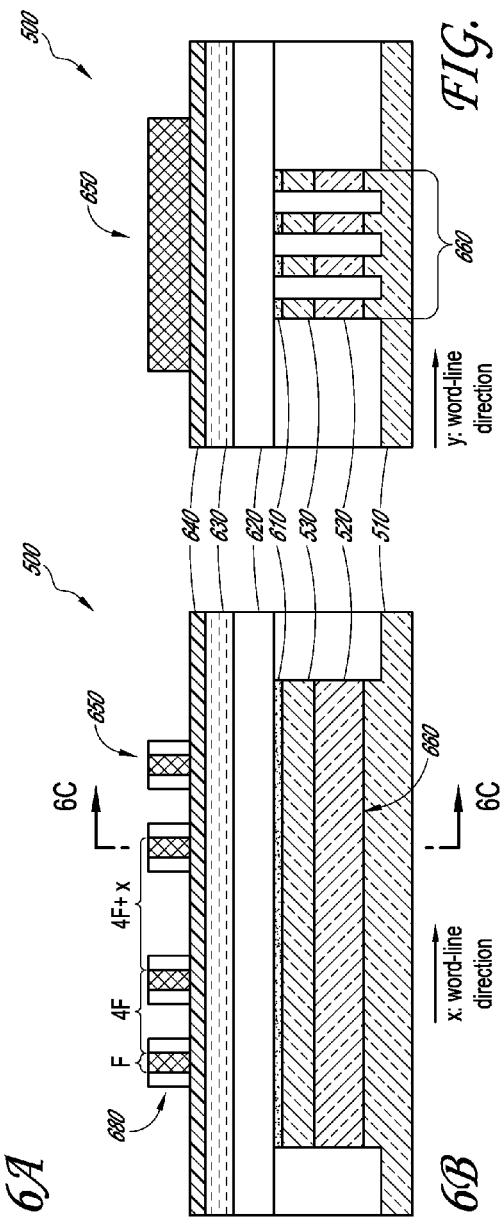
FIG. 6A
FIG. 6B
FIG. 6C

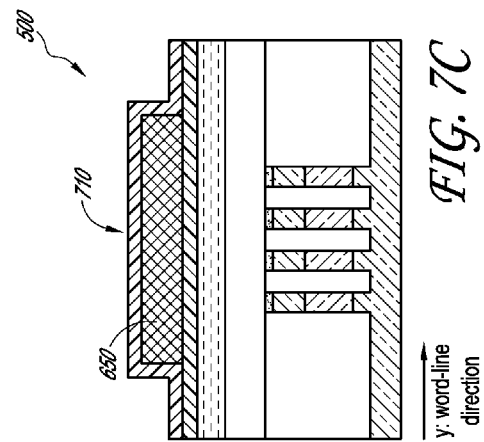
FIG. 7A
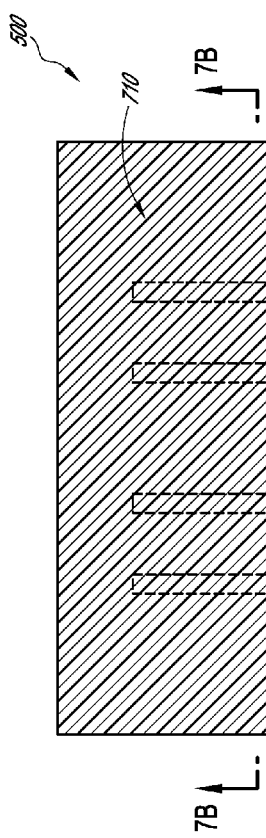
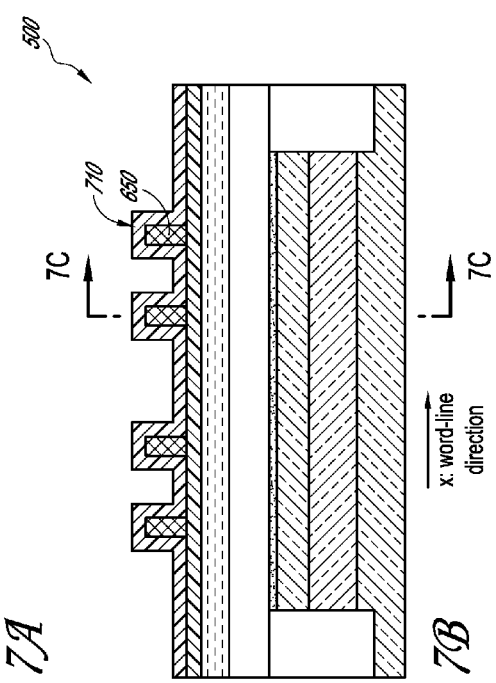
FIG. 7B
FIG. 7C

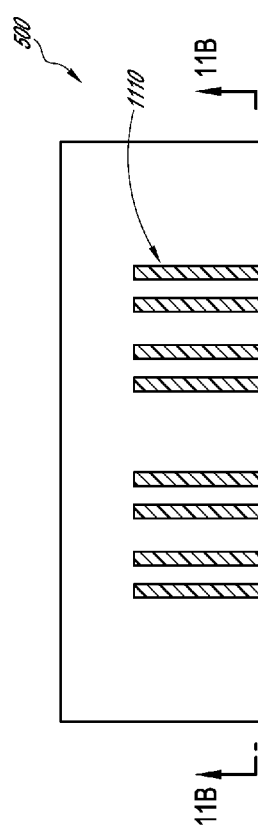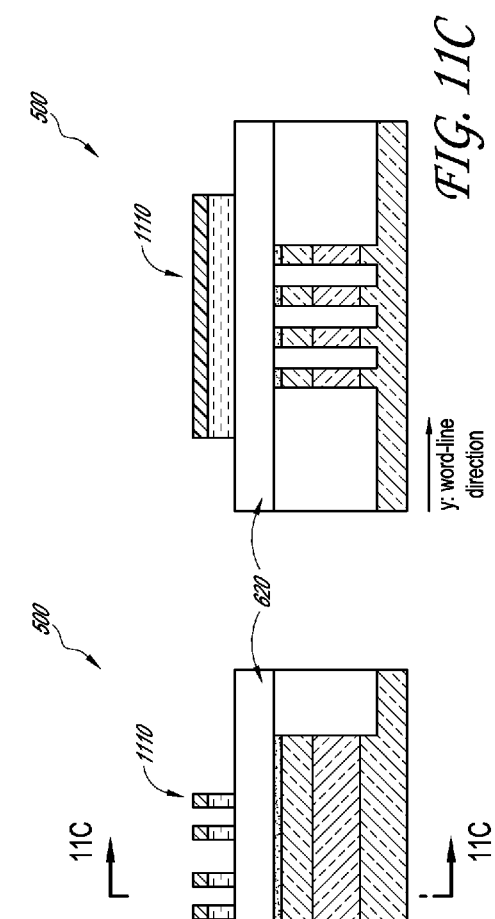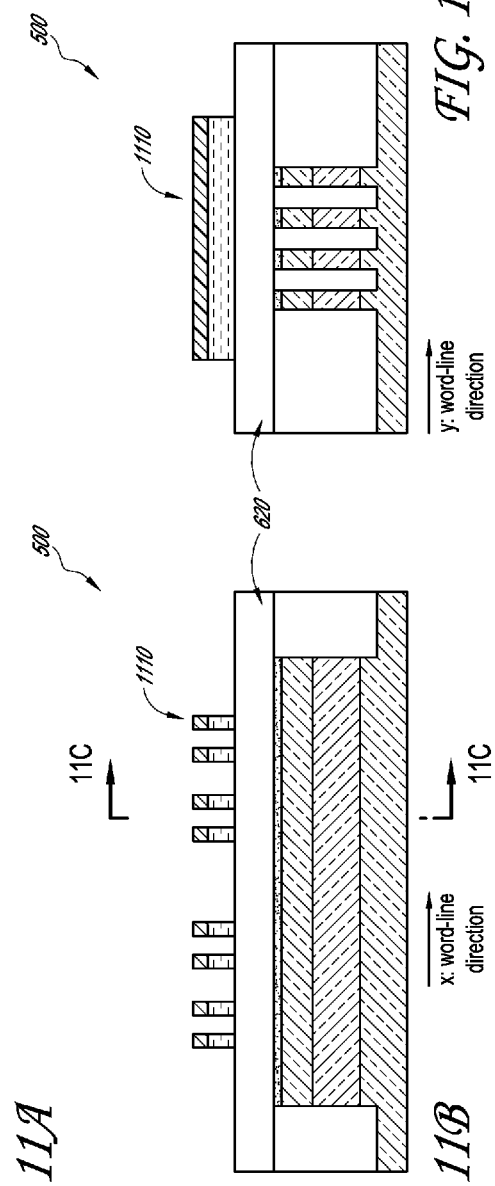

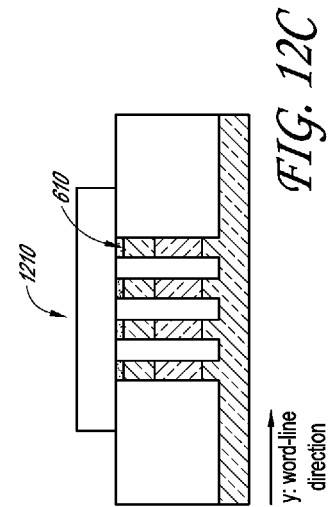
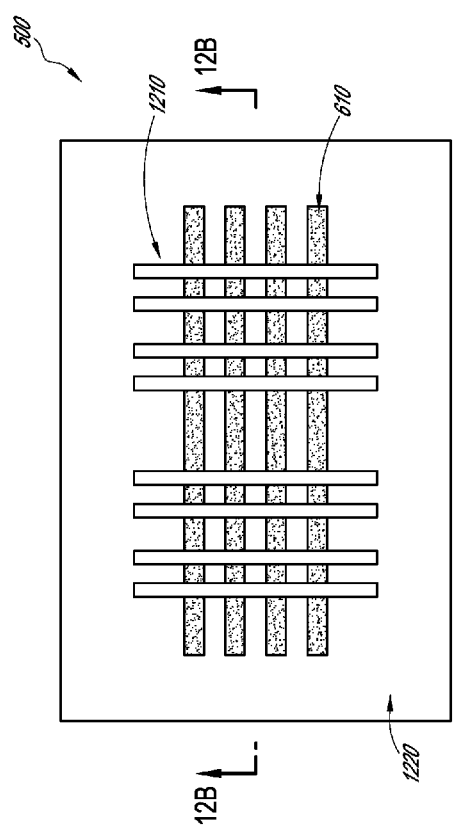
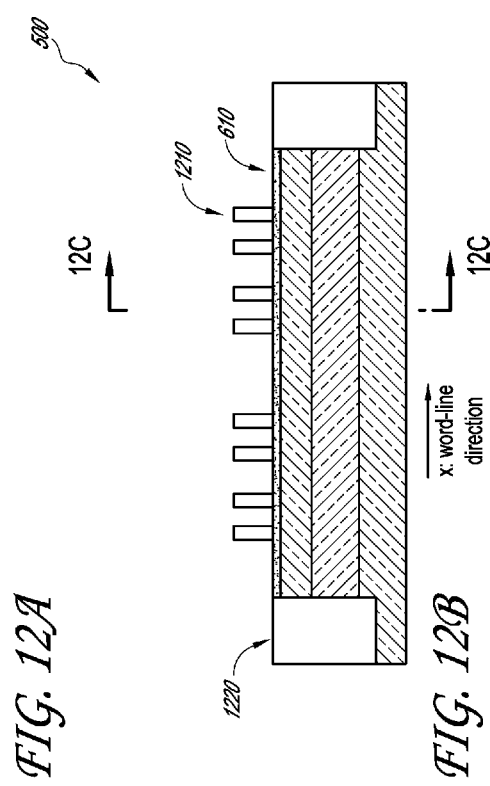

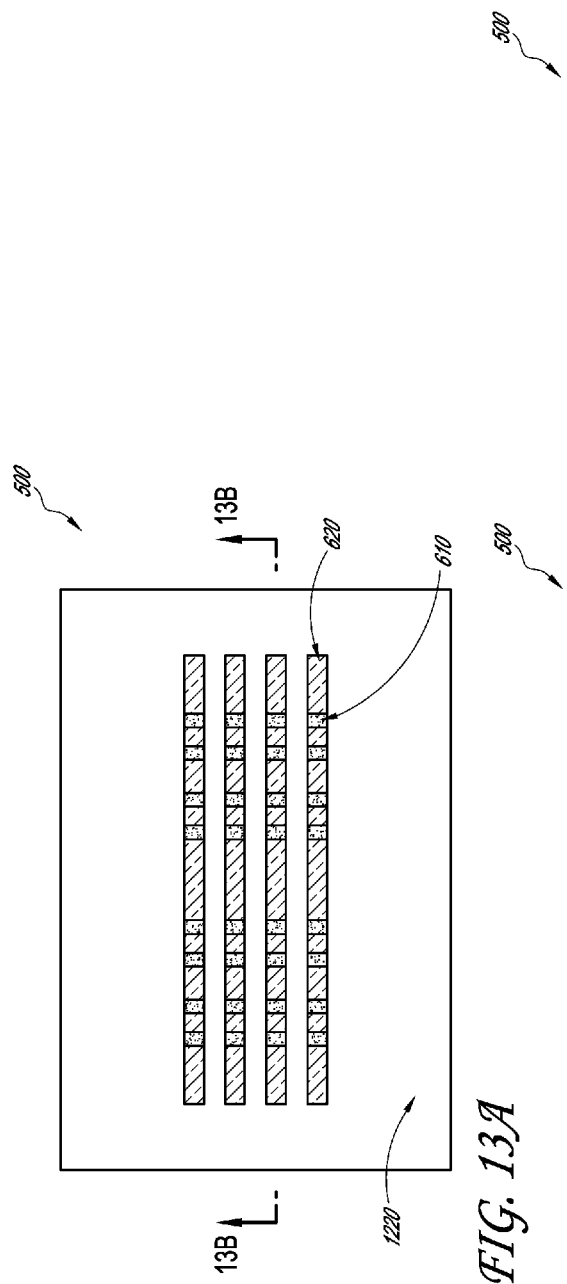
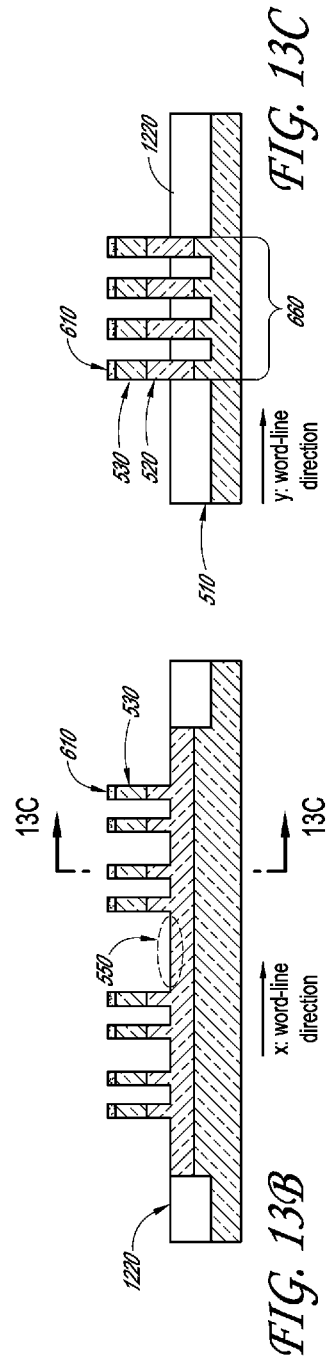
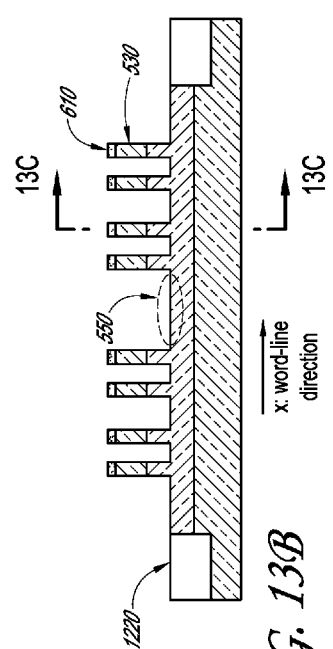

METHOD, SYSTEM AND DEVICE FOR RECESSED CONTACT IN MEMORY ARRAY

FIELD

Subject matter disclosed herein may relate to integrated circuit devices, and may relate, more particularly, to memory-related circuitry.

BACKGROUND

Integrated circuit devices, such as memory devices, for example, may be found in a wide range of electronic devices. For example, memory devices may be used in computers, digital cameras, cellular telephones, personal digital assistants, etc. Factors related to a memory device that may be of interest to a system designer in considering suitability for any particular application may include, physical size, storage density, operating voltages, granularity of read/write operations, throughput, transmission rate, and/or power consumption, for example. Other example factors that may be of interest to system designers may include cost of manufacture and/or ease of manufacture.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

FIGS. 6A-6C are illustrations depicting top plan and cross-sectional views of an example memory device, such as a PCM device, at one stage of processing according to an embodiment.

FIGS. 7A-7C are illustrations depicting top plan and cross-sectional views of an example memory device, such as a PCM device, at a subsequent stage of processing according to an embodiment.

FIGS. 11A-11C are illustrations depicting top plan and cross-sectional views of an example memory device, such as a PCM device, at a subsequent stage of processing according to an embodiment.

FIGS. 12A-12C are illustrations depicting top plan and cross-sectional views of an example memory device, such as a PCM device, at a subsequent stage of processing according to an embodiment.

FIGS. 13A-13C are illustrations depicting top plan and cross-sectional views of an example memory device, such as a PCM device, at a subsequent stage of processing according to an embodiment.

Reference is made in the following detailed description to accompanying drawings, which form a part hereof, wherein like numerals may designate like parts throughout to indicate corresponding and/or analogous components. It will be appreciated that components illustrated in the figures have not necessarily been drawn to scale, such as for simplicity and/or clarity of illustration. For example, dimensions of some components may be exaggerated relative to other components. Further, it is to be understood that other embodiments may be utilized. Furthermore, structural and/or other changes may be made without departing from the scope of claimed subject matter. It should also be noted that directions and/or references, for example, up, down, top, bottom, and so on, may be used to facilitate discussion of drawings and/or are not intended to restrict application of claimed subject matter. Therefore, the following detailed description is not to be taken to limit the scope of claimed subject matter and/or equivalents.

DETAILED DESCRIPTION

Figure 1:
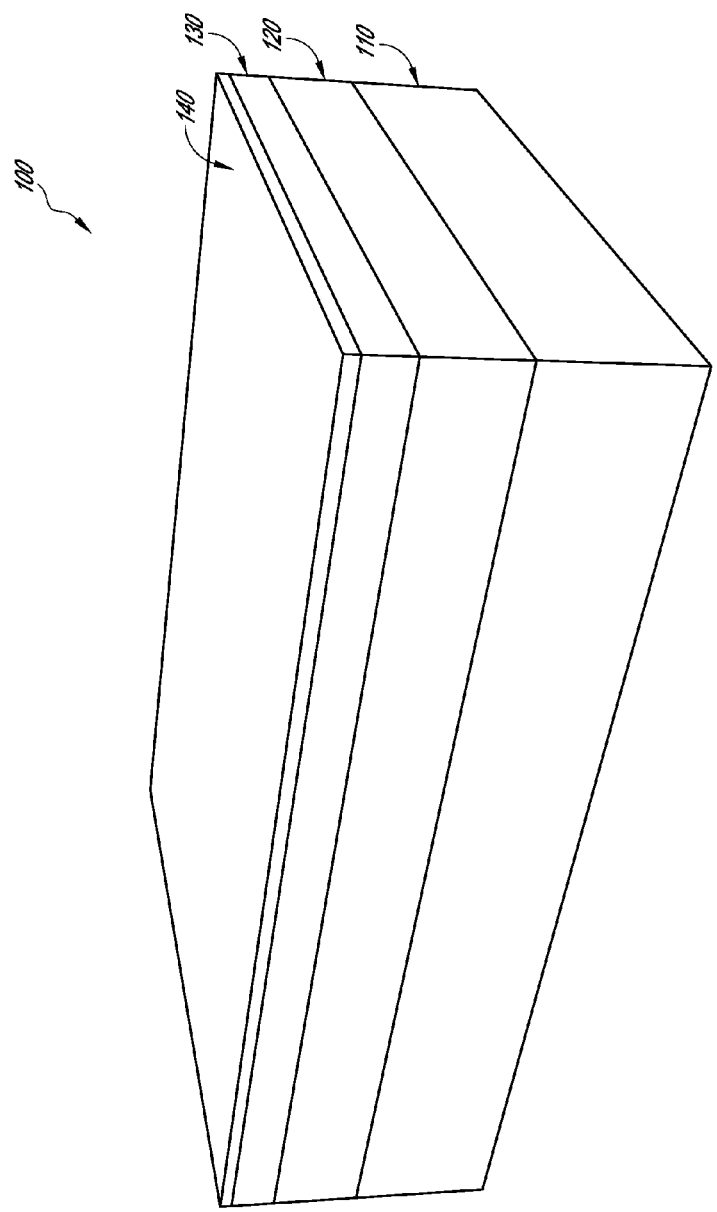
FIG. 1 is an illustration depicting an isometric view of an example epitaxial stack for an example memory device, such as a phase change memory (PCM) device, according to an embodiment.

FIG. 1 is an illustration depicting an isometric view of an example semiconductor layer stack for an example memory device, such as a PCM device, according to an embodiment. In an embodiment, a memory device, such as PCM device, may be fabricated at least in part by creating an epitaxial stack 100 comprising a substrate 110, a cathode region 120, and/or an anode region 130. A sealing region 140 may also be formed over and/or on a semiconductor layer stack. In an embodiment, the substrate 110 may comprise a p-type semiconductor, such as p-type silicon, for example. The cathode region 120 may comprise an n-type semiconductor, such as n-type silicon, in an embodiment. Also, in an embodiment, the anode region 130 may comprise a p-type semiconductor, such as p-type silicon, for example. The cathode region 120 and the anode region 130 may be formed, e.g., by epitaxial deposition. The skilled artisan will appreciate that, in other arrangements, vertical stacks of differently doped semiconductor layers can be formed by non-epitaxial techniques, such as by differently doping regions of a bulk semiconductor substrate. Additionally, the skilled artisan will appreciate that examples of p-type and n-type doping provided herein can be reversed in other examples. The sealing region 140 may comprise a dielectric material, such as silicon nitride, for example.

In an embodiment, a semiconductor layer stack, such as the illustrated epitaxial stack 100, may formed in an area of a wafer in which circuitry in which a dielectric material, such as a silicon oxide material, may have been previously deposited or otherwise formed. The semiconductor layer stack may be formed and/or utilized in conjunction with a shallow trench isolation (STI) configuration and/or architecture, for example. In an embodiment, an array of selector transistors for a respective array of memory cells, such as phase change memory (PCM) storage cells, may be patterned from a semiconductor layer stack, such as the illustrated epitaxial stack 100, as discussed below.

Figures 2A, 2B:
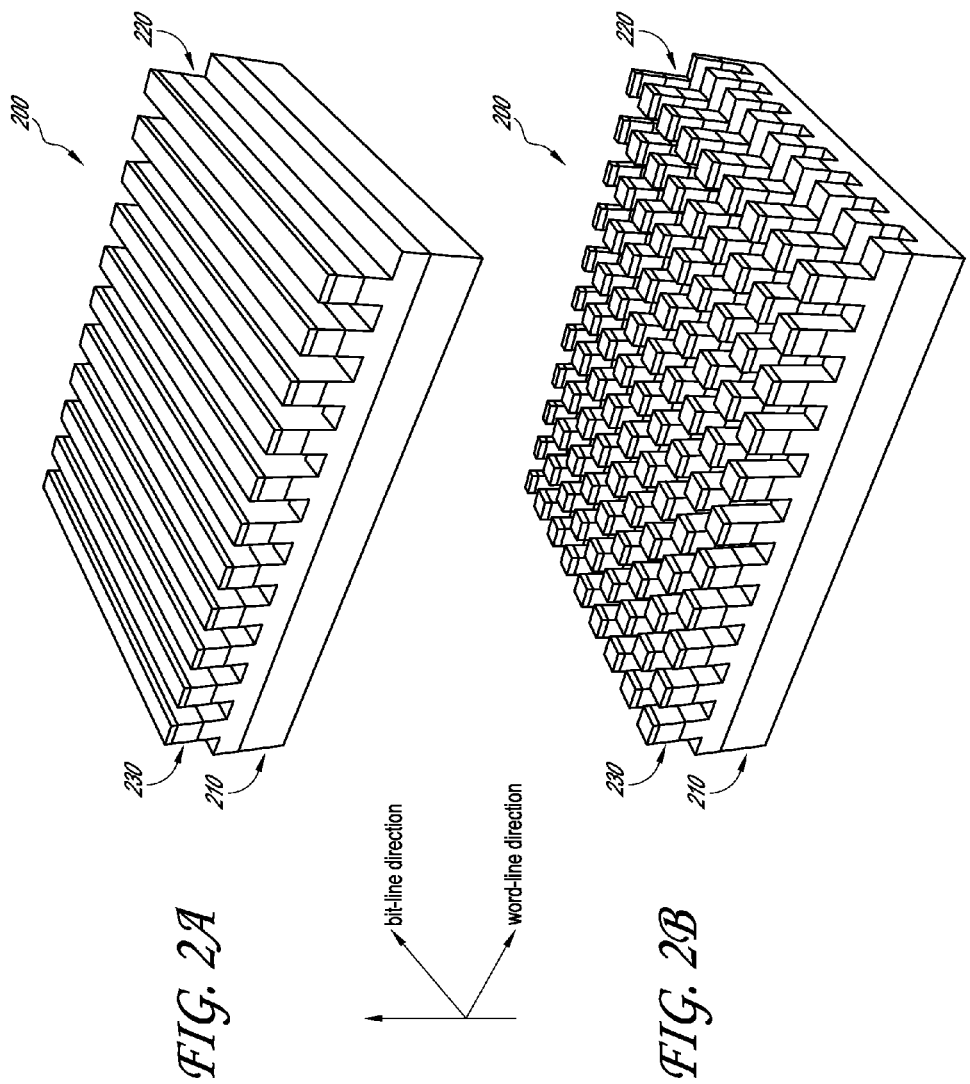
FIGS. 2A and 2B are illustrations depicting isometric views of a portion of an example memory device, such as a PCM device, according to an embodiment.

FIGS. 2A and 2B are illustrations depicting isometric views of a portion of an example memory device, such as a PCM device 200, according to an embodiment. In an embodiment, a semiconductor layer stack, such as the illustrated epitaxial stack 100 discussed above and depicted in FIG. 1, may be patterned to form an array of selector transistors that may be utilized with an array of PCM memory cells, for example. For example, selector transistors may comprise bipolar junction transistors (BJT), and individual selector transistors may comprise a collector, a base, and/or an emitter. In an embodiment, individual BJT selector may include a collector material 210, comprising a p-type silicon substrate similar to substrate 110 discussed above and depicted in FIG. 1. Individual BJT selector transistors may also include a base material 220, comprising an n-type silicon cathode material similar to cathode 120 discussed above and depicted in FIG. 1. Also, in an embodiment, individual BJT selector transistors may also include emitters 220, comprising a p-type silicon anode material similar to anode 130 discussed above and depicted in FIG. 1.

In an embodiment, an array of selector transistors for the PCM device 200 may be patterned utilizing a pitch multiplication operation, such as a self-aligned, double-patterning (SADP) technique. Utilization of an SADP technique to form selector transistors from a semiconductor layer stack, such as the illustrated epitaxial stack 100, may provide a benefit of not calling for use of more complicated mask operations, as compared with conventional techniques, for example. A fabrication process may be simplified, for example, by a reduction in an amount of lithographic masks and/or utilization of self-aligned techniques whereby existing structures may be utilized as masks during integrated circuit fabrication. Simplified fabrication techniques may improve manufacturing yield and/or device reliability, for example, and/or may reduce manufacturing time and/or costs. Additionally, by allowing formation of features having dimensions smaller than would otherwise be possible utilizing lithographic techniques, greater memory density may be achieved, among other potential benefits including improved power consumption and device performance, for example.

As depicted in FIG. 2A, columns may be patterned in a semiconductor layer stack, such as the illustrated epitaxial stack 100 (FIG. 1), in a bit-line direction and in FIG. 2B rows may be patterned in a word-line direction, for example. Columns (bit-line direction) may be patterned according to a shallow trench isolation (STI) process, while the rows (word-line direction) may be patterned according to a deep trench isolation (DTI) process. DTI trenches are shown etched into the substrate 210 in FIG. 2B, and similarly in the embodiments described below, to ensure separation of word-lines. Although FIGS. 2A and 2B depict columns being formed in a bit-line direction followed by rows being formed in a word-line direction, claimed subject matter is not limited in scope in this respect, and the assignment of columns to bit-lines and rows to word-lines is conventional but arbitrary. Moreover, in other embodiments, an epitaxial stack may be patterned in a word-line direction followed by patterning in a bit-line direction. Also, in an embodiment, a word-line direction may cross with a bit-line direction, but the lines may not be orthogonal.

Figure 3:
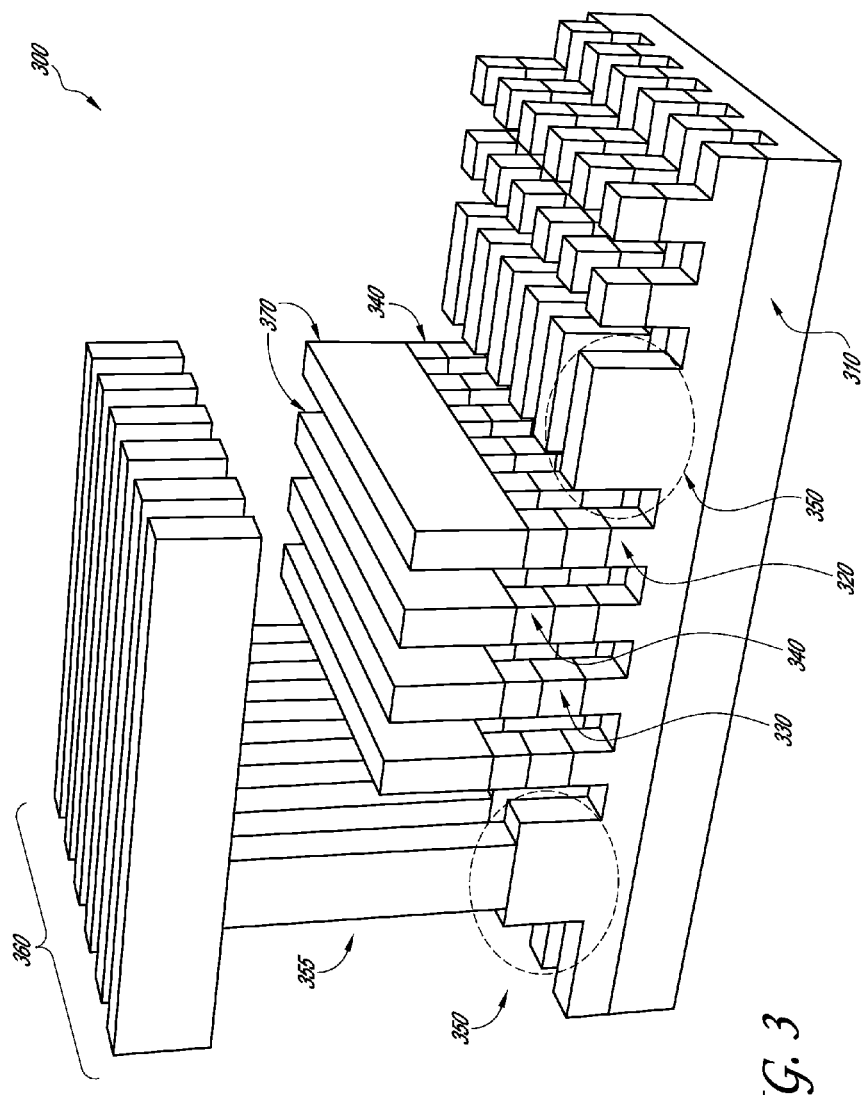
FIG. 3 is an illustration depicting an isometric view of a portion of an example memory device, such as a PCM device, according to an embodiment.

FIG. 3 is an illustration depicting an isometric view of a portion of an example memory device, such as a PCM device 300, according to an embodiment. In an embodiment, the PCM device 300, may employ one or more transistors, such as one or more bipolar junction transistors, for example, as selectors for individual memory cells. For example, the memory device may comprise one or more transistors including one or more collector components 310, one or more base components 320, and one or more emitter components 330. In an embodiment, collector 310 may comprise a p-type silicon material, base 320 may comprise an n-type silicon material, and emitters 330 may comprise p-type silicon material, for example. Also, in an embodiment, an emitter, base, and collector combination may form one or more bipolar junction transistors, for example. In an embodiment, a base component 320, a collector component 310, and one or more emitter components 330, may comprise one or more transistors, wherein a base component 320 and a collector component 310 may be common across one or more transistors, although claimed subject matter is not limited in scope in these respects. For the examples described herein in connection with FIGS. 3-5, one or more insulating materials separating conductive features within the example memory devices are omitted for ease of illustration.

In an embodiment, a memory cell, such as phase change memory (PCM) cell 340, may be selected, such as by use of sufficient and/or appropriate signals, such as voltage signals, with a first electrode, such as word-line electrode 360, and/or with a second electrode, such as bit-line electrode 370. An electrically conductive component, such as an "electrode," refers to a component that may be utilized to route signals and/or to supply power within a memory array. An electrically conductive component, such as an electrode, may comprise a sufficiently electrically conductive material, such as polysilicon, carbon, and/or metallic material, such as tungsten, titanium nitride, and/or titanium aluminum nitride, for example, for use in a memory device. Example electrically conductive components may include, for example, word-line interconnects 355, word-line contacts 350, word-line electrodes 360, and/or bit-line electrodes 370. Of course, claimed subject matter is not limited in scope in these respects. Other materials may, of course, also be used in one or more embodiments.

For a memory device, such as PCM device 300, a memory cell, such as phase change memory (PCM) cell 340, may comprise a chalcogenide material, in an embodiment. A PCM cell, for example, may have a configuration to retain or store a memory state comprising one of at least two different selectable states. In a binary system, states may comprise a binary "0" value or a binary "1" value, where a "set" state, representing a binary value of "1," for example, may correspond to a more crystalline, more conductive state for a PCM material and a "reset" state, representing a binary value of "0," for example, may correspond to a more amorphous, more resistive state. In other systems, at least some individual memory cells may have a configuration to store more than two levels or states. In a PCM array, heat sufficient to change a phase of a memory cell may be achieved by use of a current and/or voltage pulse, in an embodiment, either through an adjacent heater or through self-heating due to current flow through the phase change material itself. Further, in one or more example embodiments, memory devices may comprise one or more technologies other than PCM, such as resistive memory technologies and/or other types of memory, and claimed subject matter is not limited in scope in this respect.

In one or more embodiments, challenges may be faced in electrically connecting word-line electrodes 360 to base components 320 of selector transistors, for example. Looking at FIG. 2, for example, it may be seen that merely connecting a word-line electrode to a particular line of selector transistors in an array 200, for example, would bring the word-line electrode into contact with an anode, or emitter, portion of one or more selector transistors. FIG. 3 depicts word-line contacts 350 that may be formed, for example, by heavily doping with n-type atoms a word-line contact region after a semiconductor layer stack, such as epitaxial stack 100 (FIG. 1), has been patterned to form an array of selector transistors.

Figure 4:
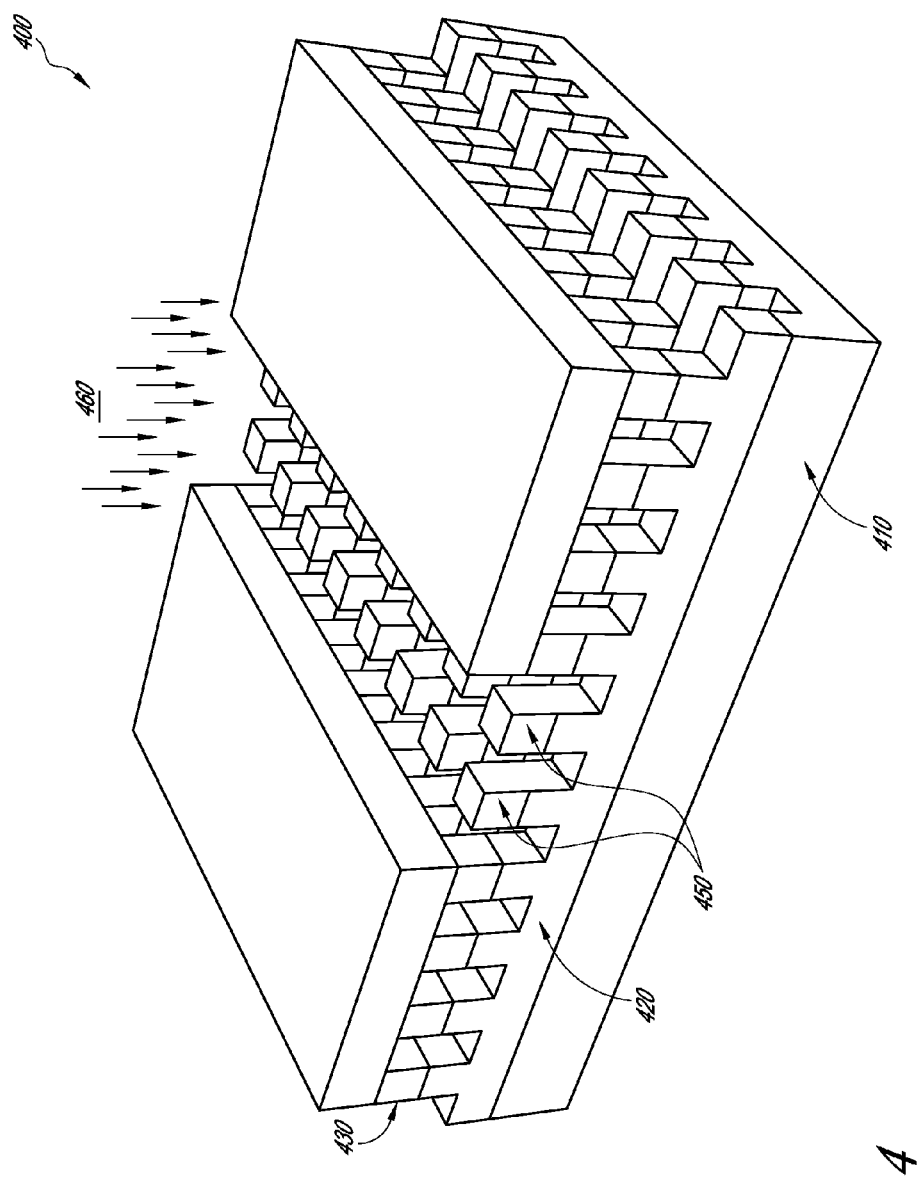
FIG. 4 is an illustration depicting an isometric view of a portion of an example memory device, such as a PCM device, according to an embodiment.

FIG. 4 is an illustration depicting an isometric view of a portion of an example conventional memory device, such as a PCM device 400, according to an embodiment. PCM device 400, in an embodiment, may comprise a collector material 410, a base component 420, and emitters 430, for example formed according to techniques discussed above in connection with FIG. 2. FIG. 4 depicts a word-line contact region 450, comprising one or more emitters 430, being heavily doped with n-type atoms to change electrical properties of emitters 430 in word-line contact region 450. In an embodiment, one or more masks may be utilized to protect portions of PCM device 400 not selected for doping. One disadvantage of creating word-line contact regions in this manner may be a need to utilize a relatively expensive mask operation that may need to adhere to relatively tight tolerances due to relatively small feature size, for example. Additionally, challenges may be faced in doping p-type semiconductor material anode regions to generate word-line contact regions with sufficient electrical conductivity. In other words, a potential disadvantage of utilizing a mask operation to dope anode material to form word-line contact regions may comprise difficulties in achieving low-resistance word-line contacts.

Figure 5:
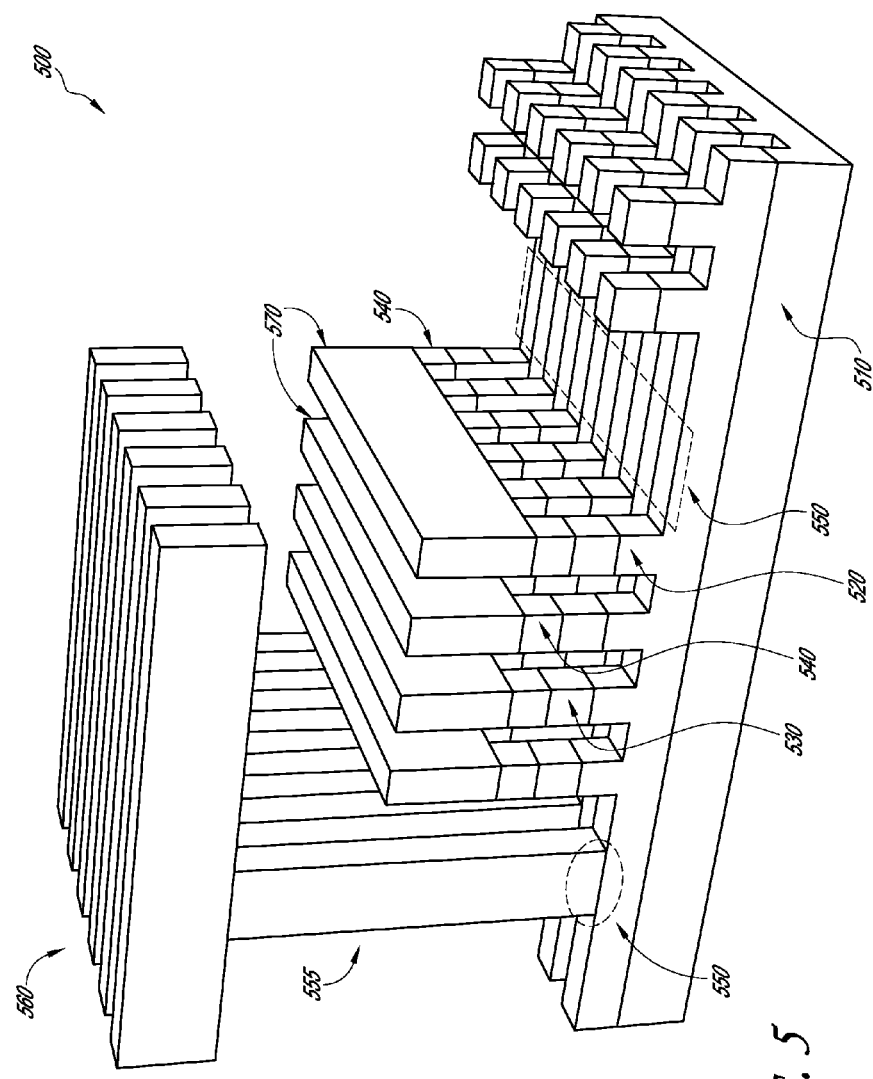
FIG. 5 is an illustration depicting an isometric view of a portion of an example memory device, such as a PCM device, according to an embodiment.

FIG. 5 is an illustration depicting an isometric view of a portion of an example memory device, such as a PCM device 500, according to an embodiment. In an embodiment, a memory cell with a storage element, such as phase change memory (PCM) storage component 540, may be selected, such as by use of sufficient and/or appropriate signals, such as voltage signals, with a first electrode, such as word-line electrode 560, and/or with a second electrode, such as bit-line electrode 570. In an embodiment, potential difficulties and/or challenges and/or disadvantages of memory devices 400 (FIG. 4), for example, may be addressed at least in part by formation of recessed word-line contact regions 550, whereby word-line interconnects 555 may connect substantially directly to base component 520. The illustrated word-line contact regions 550 make contact with a word-line interconnect 555, at a cathode, or base component 520, level, which is recessed relative to top level of the select transistors represented by anode or emitter regions 510. For example, referring to FIG. 3, word-line interconnect 355 is depicted as contacting word-line contact region 350 at a height approximately equivalent to that of emitters 330. By contrast, referring to FIG. 5, word-line interconnect 555 is depicted as contacting word-line contact region 550 at a level approximately equivalent to base component 520, in an embodiment.

Also, in an embodiment, base component 520 may comprise n-type silicon material. Additionally, collector component 510 may comprise p-type silicon, and emitters 530 may comprise p-type silicon, for example, although claimed subject matter is not limited in scope in these respects. In an embodiment, collector component 510 may be referred to as a p-type silicon substrate, base component 520 may be referred to as an n-type cathode, and emitters 530 may be referred to as p-type anodes, for example.

In an embodiment, word-line contact regions 550 may be formed at least in part by utilizing different pitch multiplication patterns among word-lines and/or bit-lines, as described more fully below in connection with FIGS. 6A-14. In general, and in an embodiment, pattern and/or pitch interruption along a word-line direction utilizing SASP techniques may be utilized to form word-line contact regions 550, allowing substantially direct connection of word-line interconnects 555 to base component 520, for example. In an embodiment, pattern and/or pitch interruption utilizing pitch multiplication techniques may provide for avoiding utilization of a mask operation to dope anode regions to create word-line contact regions, and challenges and/or disadvantages of utilizing such an approach may be avoided and/or ameliorated. The word-line contact region 550 can represent an interruption of a pitch multiplication pattern on either side of the recessed word-line contact region 550. The pitch multiplication pattern of an illustrated embodiment is applied, on either side of the word-line contact region 550, to memory cells on either side, particularly to the width dimensions of selector transistors (e.g., emitters) and storage components (e.g., phase change memory components).

In an embodiment, by utilizing a pitch multiplication operations, such as a self-aligned double patterning (SADP) technique, for example in a manner depicted in FIGS. 6A-14, or in a similar manner, connections between one or more electrically conductive electrodes, such as one or more word-line electrodes 560, and one or more base components 520, may be made in a more reliable manner, and/or in a manner that avoids utilizing an additional mask operation, in accordance with one or more embodiments. For example, for embodiment 500 depicted in FIG. 5, a base component 520 may be patterned, at least in part, by forming one or more trenches positioned in a semiconductor material and elongated in a direction approximately orthogonal to word-line electrode 560. In an embodiment, a shallow-trench isolation (STI) structure may be implemented to separate emitters and memory cell storage elements, and at the same time and same depth defining the word-line contact regions 550, although claimed subject matter is not limited in scope in this respect. In an embodiment, one or more trenches in accordance with an STI implementation may be formed at least in part by a plasma etch process, although again, claimed subject matter is not limited in scope in this respect. Also, in an embodiment, a base component 520 may be formed at least in part by epitaxy, although claimed subject matter is not limited in scope in this respect. For example, a solid epitaxial material of n-doped silicon may be formed, such as by vapor phase deposition, over collector material 510, in an embodiment. In an embodiment, a base component 520 of a selector transistor may be heavily doped, such as with an n-buried implant, for example, to reduce resistance of the base component 520.

In FIGS. 6A-14, discussed below, cross-sectional views of an illustration of a portion of an example PCM memory array are depicted showing various stages of an example fabrication process, in accordance with an embodiment. Of course, claimed subject matter is not limited in scope to the particular examples described herein. In FIGS. 6A-14, a top view is provided. Additionally, cross-sectional views looking in two directions, an "X" or word-line direction and a "Y" or bit-line direction, are provided. In an embodiment, an "X" direction may be substantially orthogonal to a "Y" direction, although in other embodiments the lines need not be orthogonal. Not shown in any detail in FIGS. 6A-14, and not discussed herein, is circuitry that may be formed around a periphery of a storage array, for example. Rather, FIGS. 6A-14 are meant to illustrate example aspects related to fabrication of one or more recessed word-line contact regions 550, in accordance with one or more embodiments.

FIGS. 6A-6C are illustrations depicting a top view and also depicting cross-sectional views of a portion of example PCM device 500 showing a stage of an example fabrication process, in accordance with an embodiment. At a stage of an example fabrication process of example PCM device 500 depicted in FIG. 5, an epitaxial stack comprising a substrate 510, also referred to as a collector component, a cathode region 520, also referred to as a base component, and an anode region 530, also referred to as an emitter, may have been previously patterned into one or more word-line strings 660, comprising one or more rows of cathode material 520, emitter material 530, and a dielectric material, such as silicon nitride material 610, in an embodiment. In the discussion that follows in connection with FIGS. 6A-14, bit-line patterns may be created, according to one or more embodiments.

As depicted in FIGS. 6A-6C, a dielectric material, such as silicon oxide material 620, may be deposited and/or otherwise formed over and/or on word-line strings 660, in an embodiment. In an embodiment, a mask may be formed over and/or on silicon oxide material 620. In the illustrated example a hard mask may be first formed by depositing and/or otherwise forming a carbon material 630 over and/or on silicon oxide material 620, and by depositing and/or otherwise forming a dielectric material, such as silicon nitride material 640, over carbon material 630, for example.

As further depicted in FIGS. 6A-6C, a photoresist (not shown) and another hard mask material, such as bottom anti-reflective coating (BARC) material, may be deposited or otherwise formed over and/or on nitride material 640, and the hard mask material may be patterned to form lines 650, in an embodiment. Also, in an embodiment, the lines 650 may be patterned to have a pitch more relaxed than a pitch for an example PCM storage array. For example, the lines 650 may comprise a width greater than a reduced feature size "α*F (with α>1)", for example, as depicted in FIG. 6B, where F represents the node size for the underlying array. Also, in an embodiment, to achieve a width of approximately a reduced feature size "F", a trimming operation may be performed on lines 650, as depicted by trimmed regions 680. An example trimming operation for BARC material of lines 650 may comprise an anisotropic etch, although claimed subject matter is not limited in this respect. In an embodiment, lines 650 may be trimmed to a width smaller than that obtainable via conventional lithographic techniques, for example. Thus a non-critical mask may be employed to initially define the lines and trimming may produce narrower lines without affecting the pitch.

In an embodiment, and as depicted in FIG. 6B, pairs of lines 650 may be formed with a pitch of "4F+x". In an embodiment, individual pairs of lines 650 may be spaced apart by an approximate distance of "4F", meaning approximately four times a width of a reduced feature/node size for a particular manufacturing technology. For example, individual BJT devices shown in FIG. 5 may have a width and minimum separation from neighboring devices of F. The emitters 530 of such individual BJT devices, and the associated PCM storage components 540 of the memory cells, similarly have a width and minimum separation from emitters of neighboring devices of F. A pitch of "4F+x" may denote a pitch approximately equivalent to four times a width of a reduced feature size for a particular manufacturing technology plus additional spacing that will ultimately be employed in defining the contact region. In the illustrated example, x is approximately 4F, such that the pitch for one pair of lines is approximately double the pitch (e.g., about 8F) of adjacent more closely spaced pairs (e.g., about 4F). As may be seen in remaining FIGS. 7A-14, a space of approximately 4F+x between pairs of lines 650 may be exploited to create word-line contact regions 550, for example. Other adjacent pairs of lines 650 may have a different pitch, illustrated as 4F, such that the lines with pitch 4F+x can represent a pitch interruption in the tighter pitch pattern of surrounding lines 650, and can be considered a relaxation in pitch relative to neighboring pairs of lines 650. The actual spacing between features bordering on the pitch interruption region, which will be the same as the word-line contact region in this example, may be altered by the subsequent self-aligned double patterning process, as will be understood from the description below, but remains larger than the spacing between adjacent features in the rest of the tightly spaced array. In an embodiment, a width of a reduced feature size F may comprise approximately a width of a phase change memory storage component, such as PCM storage component 540.

FIGS. 7A-7C are illustrations depicting a top view and also depicting cross-sectional views of a portion of example PCM device 500 showing a stage of an example fabrication process, in accordance with an embodiment. As depicted in FIGS. 7A-7C, a conformal spacer layer 710, such as a low-temperature oxide (LTO) material, may be conformally deposited and/or otherwise formed over and/or on example PCM device 500, including over and/or on lines 650, in an embodiment. In another embodiment, the conformal spacer layer 710 comprises silicon nitride.

Figure 8A:
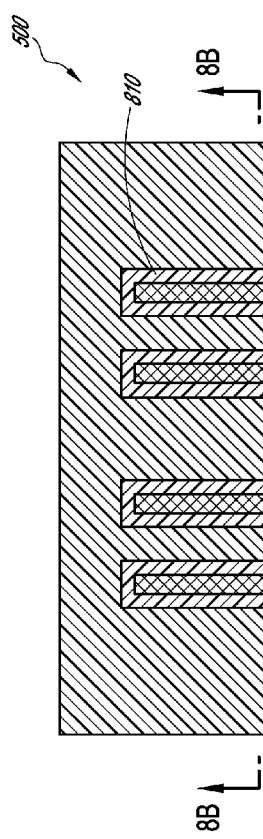
FIGS. 8A-8C are illustrations depicting top plan and cross-sectional views of an example memory device, such as a PCM device, at a subsequent stage of processing according to an embodiment.
Figure 8C:
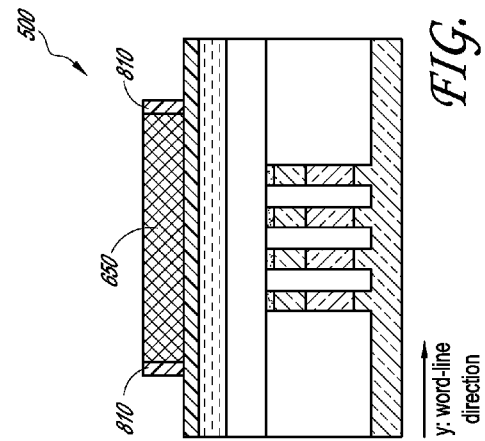
Figure 8B:
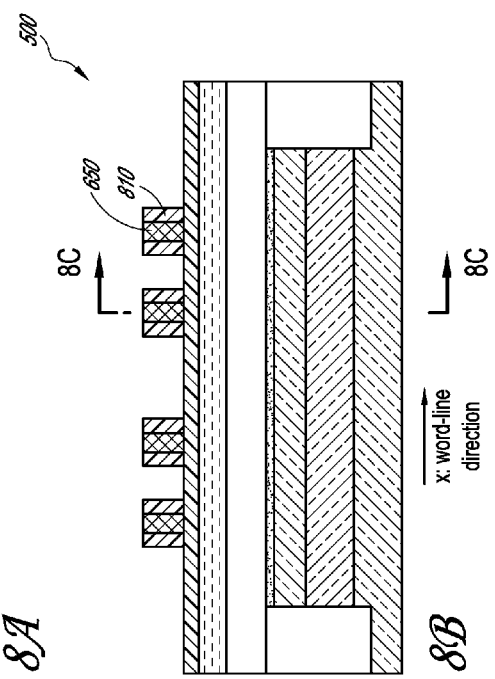

FIGS. 8A-83 are illustrations depicting a top view and also depicting cross-sectional views of a portion of example PCM device 500 showing a stage of an example fabrication process, in accordance with an embodiment. As depicted in FIGS. 8A-8C, the conformal spacer layer 710 may be etched, such as by an anisotropic spacer etch, to form sidewall spacers 810 positioned on substantially vertical sides of lines 650, in an embodiment.

Figure 9A:
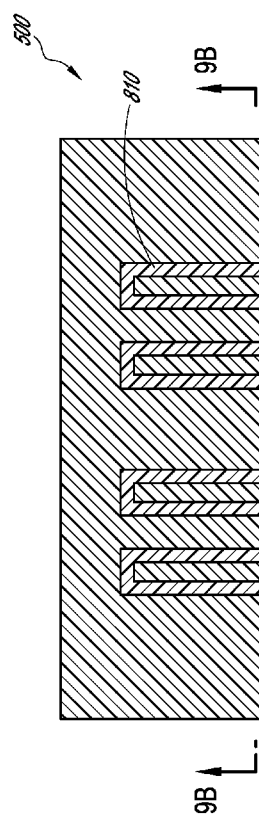
FIGS. 9A-9C are illustrations depicting top plan and cross-sectional views of an example memory device, such as a PCM device, at a subsequent stage of processing according to an embodiment.
Figure 9C:
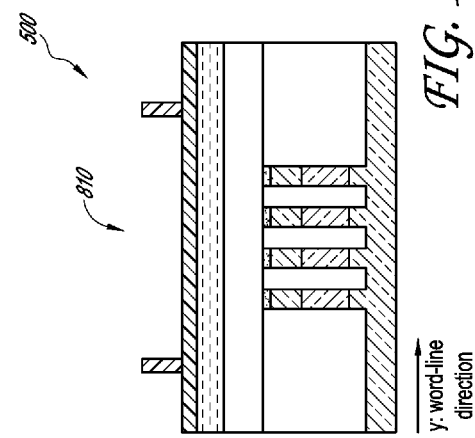
Figure 9B:
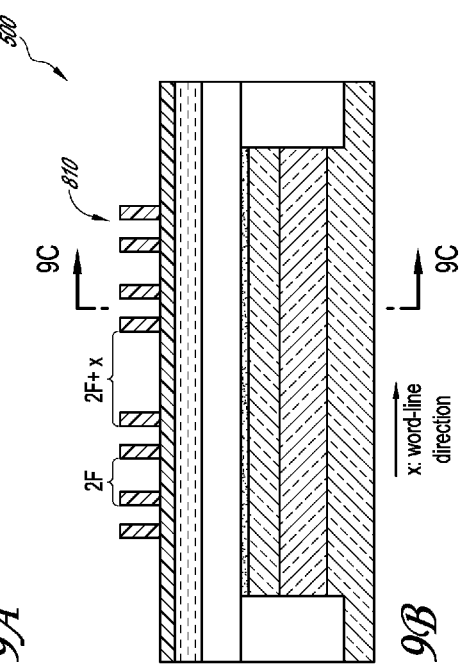

FIGS. 9A-9C are illustrations depicting a top view and also depicting cross-sectional views of a portion of example PCM device 500 showing a stage of an example fabrication process, in accordance with an embodiment. As depicted in FIGS. 9A-9C, remaining BARC material may be etched to remove lines 650 while avoiding substantial damage to the spacer layer 710. As further depicted in FIGS. 9A-9C, removing lines 650 may result in formation of spacers 810 that may be utilized to further pattern word-line strings 660, as discussed below. As the lines 650 were employed to provide patterns for the spacers 810 and then removed, the lines 650 can be considered sacrificial mandrels for forming the spacers 810. The thickness of the spacer layer 710 deposited in FIGS. 7A-7C can represent F in this example, such that the pitch interruption 4F+x (FIG. 6B) has been reduced by 2F by the spacer process, which can also be referred to as a self-aligned double patterning (SADP) process, which is a species of pitch multiplication. For example, if the width of the pitch interruption in FIG. 6B was 4F+x=8F, then the corresponding pitch interruption may have a width of about 6F in FIGS. 9A-9C. Whereas the spacers 810 have a width defined to be F, and closely spaced spacers in the array are separated by about F, the width of the pitch interruption region in FIGS. 9A-9C may be 2F+x, and may be greater than 4F, as shown. In the illustrated embodiment, the pitch interruption region has a width of about 6F, such that x=4.

Figure 10A:
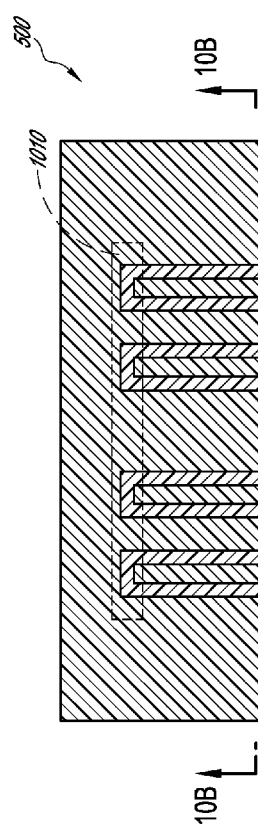
FIGS. 10A-10C are illustrations depicting top plan and cross-sectional views of an example memory device, such as a PCM device, at a subsequent stage of processing according to an embodiment.
Figure 10C:
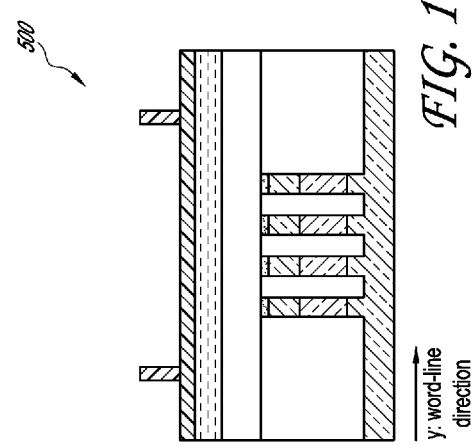
Figure 10B:
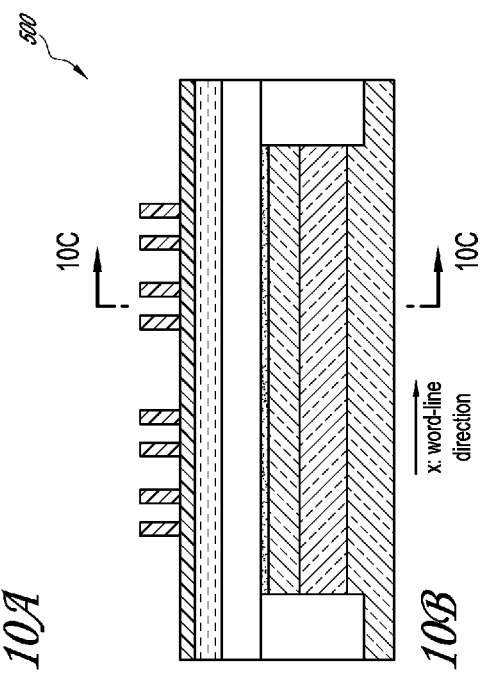

FIGS. 10A-10C are illustrations depicting a top view and also depicting cross-sectional views of a portion of example PCM device 500 showing a stage of an example fabrication process, in accordance with an embodiment. The hard mask spacers 810 of FIGS. 9A-9C form closed loops. To create isolated lines from the spacers 810, the loop ends may be removed. For example, as depicted in FIG. 10A with dashed lines, a cut mask 1010 may be utilized to remove selected LTO material to avoid shunted and/or shorted strings, for example. In FIG. 10A, the elements 1010 can represent openings in a mask through with the loop ends of the spacers 810 can be etched prior to transferring the pattern into lower layers. Alternatively, the elements 1010 can represent blocking portions of a mask overlying the loop ends, such that the loop ends are ineffective during subsequent transfer of the spacer pattern into lower layers.

FIGS. 11A-11C are illustrations depicting a top view and also depicting cross-sectional views of a portion of example PCM device 500 showing a stage of an example fabrication process, in accordance with an embodiment. As depicted in FIGS. 11A-11C, the pattern of the spacers 810 (FIGS. 9A-9C), with the exception of the loop ends, may be transferred into lower layer(s). For example, a hard mask comprising silicon nitride 640 and/or carbon material 630 may be patterned to produce structures 1110 that may be utilized in self-aligned etching techniques to further pattern word-line strings 660, as described below. Structures 1110 may be patterned according to a pattern of the spacers 810 (FIGS. 9A-9C) from hard mask material comprising silicon nitride material 640 and carbon material 630, for example, utilizing an etch process, in an embodiment. In this manner, a pattern of the spacers 810 may be transferred to hard mask material, which in the illustrated embodiment comprises silicon nitride 640 and carbon material 630, to form structures 1110, for example.

FIGS. 12A-12C are illustrations depicting a top view and also depicting cross-sectional views of a portion of example PCM device 500 showing a stage of an example fabrication process, in accordance with an embodiment. As depicted in FIGS. 12A-12C, a dielectric material, such as silicon oxide 620 (FIGS. 11A-11C), may be patterned to produce structures 1210 that may be utilized in self-aligned etching techniques to further pattern word-line strings 660, as described below. Structures 1210 may be patterned according to hard mask structures 1110 comprising silicon nitride material 640 and carbon material 630, for example, utilizing an etch process, in an embodiment. In this manner, a pattern of hard mask structures 1110 (FIGS. 11A-11C) may be transferred to silicon oxide material 620 to form structures 1210, for example. FIGS. 12A-12C also show the pattern of structures 1210 crossing over the pattern of the underlying word-line strings 660, which are represented in FIGS. 12A-12C by the dielectric layer 610 at the tops of the word-line strings 660. The etching of the oxide layer 620 to leave structures 1210 may stop upon exposure of the dielectric layer 610 (which can be a different material, such as silicon nitride), at the same time exposing underlying oxide layer 1220.

Figure 14:
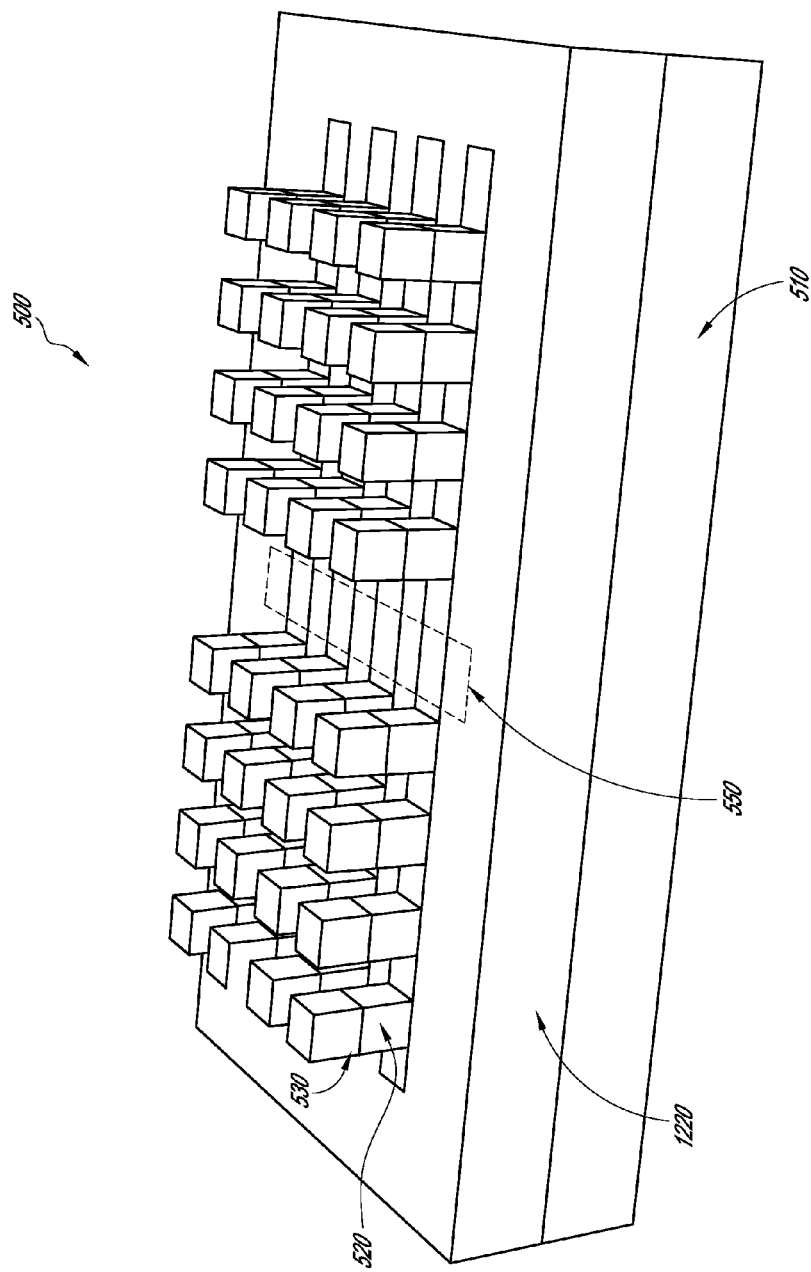
FIG. 14 is an illustration depicting an isometric view of a portion of a portion of an example memory device, such as a PCM device, at a subsequent stage of processing according to an embodiment.

FIGS. 13A-13C are illustrations depicting a top view and also depicting cross-sectional views of a portion of example PCM device 500 showing a stage of an example fabrication process, in accordance with an embodiment. As depicted in FIG. 13C, word-line strings 660 may be patterned utilizing a self-aligned etching technique according to a pattern of structures 1210 that were formed in the overlying silicon oxide material 620, in an embodiment. For example, structures 1210 may be utilized as a mask to etch word-line strings 660 to create an array of selector transistors, as depicted in FIG. 14 and as discussed below. Individual selector transistors take the shape of pillars after the etch, and may each comprise a collector component 510, comprising a p-type substrate, for example, and may further comprise a base component 520, comprising an n-type cathode, in an embodiment. The base component 520 and collector component 510 may be shared by multiple selector transistors of the array. An individual selector transistor may further comprise an individual emitter 530, comprising a p-type anode, in an embodiment, that is not shared with other selector transistors. The etch may thus define shallow trench isolation (STI) separating selector transistors of the array, and also separating memory storage elements of individual memory cells. This same etch may define, in an embodiment, the recessed word-line contact 550 at the same depth as the STI separating selector transistors of the array, and may be positioned between sets of selector transistors, in an embodiment.

As discussed above in connection with FIGS. 6A-6C, space was provided for the word-line contact 550 by properly spacing apart lines 650 in one mask layer, and this space was transmitted through intervening mask layers. As noted with respect to the spacers 810 of FIGS. 9A-9C, individual selector transistors (e.g., represented by individual emitters 530 in the BJT example of the figures) may have a width of F and minimum spacing from adjacent selector transistors of about F; whereas a width of the word-line contact 550 may be greater than 4F. The corresponding PCM storage components 540 of the memory cells may similarly have a width of F and separation of about F, except at the pattern interruption represented by the word-line contact 550. Additionally, in an embodiment, the structures 1220 used as a hard mask for this etch may also be etched, at least in part.

FIG. 14 is an illustration depicting an isometric view of a portion of a portion of an example memory device, such as a PCM device 500, according to an embodiment. As depicted in FIG. 14, a semiconductor layer stack, such as epitaxial stack 100, may be patterned in a bit-line direction and/or in a word-line direction to form an array of individual selector transistors comprising a collector component 510, a base component 520, and an emitter 530. As mentioned above, collector component 510 and base component 520 may be shared among one or more selector transistors, and individual selector transistors may comprise individual emitters 530, in an embodiment.

In an embodiment, recessed word-line contact regions 550 may be formed utilizing a pitch multiplication operation, such as a self-aligned double patterning (SADP) technique. Also, in an embodiment, pattern and/or pitch interruption along a word-line direction utilizing SADP techniques may be utilized to form word-line contact regions 550, allowing substantially direct connection of word-line interconnects, such as word-line interconnects 555 (FIG. 5), to base components 520, for example. In an embodiment, pattern and/or pitch interruption utilizing SADP techniques may avoid utilization of a mask operation to dope anode regions to create word-line contact regions, and challenges and/or disadvantages of utilizing such an approach may be avoided. In an embodiment, a semiconductor layer stack, such as epitaxial stack 100, may be formed utilizing selected and/or appropriate doping levels and/or types at individual regions of stack 100 to provide desired properties for various components of selector transistors to be formed from stack 100. For example, an n-type cathode region 120, may be doped sufficiently with appropriate materials to provide relatively low resistance base components 520, for example, and to provide relatively low resistance word-line contact regions 550, in an embodiment.

Embodiments in accordance with claimed subject matter may comprise forming one or more n+ buried word-line contact regions in a manner substantially integrated with double-patterning techniques utilized in fabricating PCM arrays with bipolar selector transistors. Benefits that may be realized may include, for example, improved manufacturing yield, improved memory device reliability, reduced manufacturing costs, and increased memory density, although claimed subject matter is not limited in these respects.

Also, in one or more embodiments, selector components for a memory array may comprise bipolar-type selectors, such as bipolar junction transistors (BJT), for example. While the examples provided herein discuss pnp BJT devices, the embodiments can also be applied to npn BJT devices with p+ buried word-line contact regions and base/cathode materials rather than the n+ materials of the examples. More generally, vertical BJT devices can be formed from stacked materials wherein a lower material having a first conductivity type, a middle material having a second conductivity type opposite to the first conductivity type, and an upper material having the first conductivity type.

In other embodiments, other types of selector transistors may be employed. For example, thyristors may be utilized, whereby patterning processes to separate individual thyristors, particularly with pitch multiplication for dense arrays, simultaneously creates room for making contact to the thyristors. The illustrated BJT embodiments employ three layers in an npn stack; a thyristor embodiment may employ, for example, five layers in a pnpnp stack, from top to bottom including a p+ emitter, n− base, p− base, n+ cathode and p− substrate, defining four junctions. The shallow trench isolation process that separates pillars and memory cells can etch through the top two junctions, thus separating p+ emitters and n-base of neighboring cells, while partially etching through the p− base. The deep trench isolation process can etch through the upper three junctions to stop the etch within the n+ cathode layer. In such an embodiment, the selector transistors (particularly p+ emitters and n-bases) can have width dimensions in accordance with a pitch multiplication pattern on either side of a word-line contact, which represents an interruption of the regular spacing of the pitch multiplication pattern on either side. Of course, claimed subject matter is not limited in scope in these respects.

The word-line contact region formed as described above may be recessed relative to the top level of the vertical selector transistors of the array. For the BJT embodiments illustrated herein, the word-line contact region is recessed relative to the tops of the emitters for the selector transistors of the array. In operation, an electrode of the memory array may be energized to energize one or more selector transistors of the memory array by way of an electrically conductive interconnect. The interconnect may be in substantially direct contact with the recessed word-line contact region. For example, the recessed contact region may be formed in a cathode material of the one or more selector transistors. Energizing the selector transistor may in turn energize one or more phase change material storage cells electrically connected to the one or more selector transistors as part of a programming operation.

Figure 15:
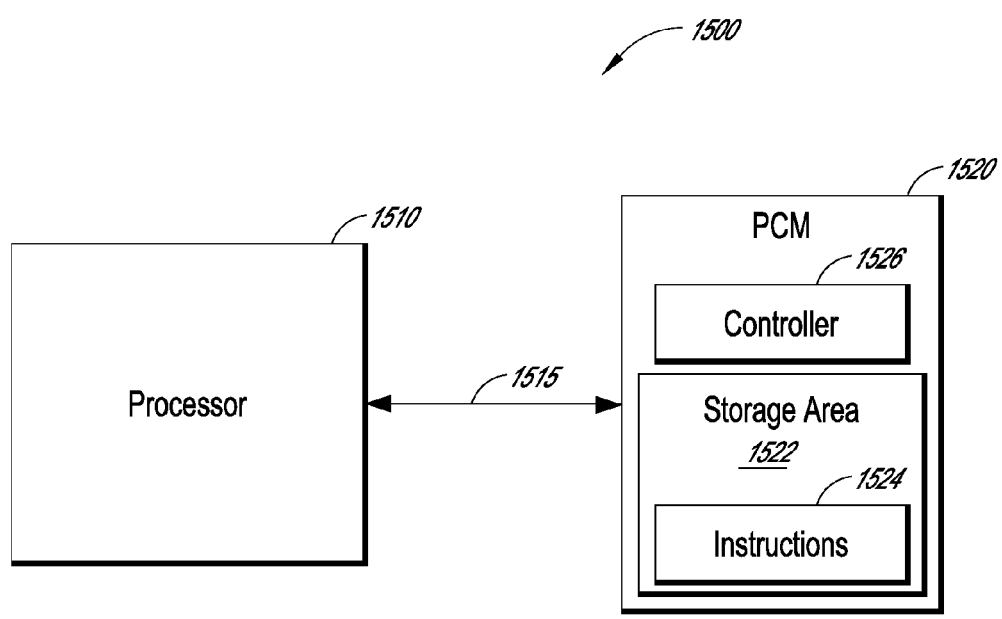
FIG. 15 is a schematic block diagram depicting a system, including a phase change memory device, according to an embodiment.

FIG. 15 is a schematic block diagram depicting an example system 1500 including an example PCM device 1520. In an embodiment, PCM device 1520 may comprise a storage area 1522 including an array of PCM cells, such as in accordance with one or more examples. PCM device 1520 may, in an example embodiment, be coupled to a processor 1510 by way of an interconnect 1515.

PCM device 1520 in an embodiment may comprise a control unit 1526. Additionally, storage area 1522 may store instructions 1524 that may include one or more applications that may be executed by processor 1510, according with an embodiment. Processor 1510 may transmit a memory access command to PCMS device 1520, for example. Control unit 1526 may access one or more memory cells of storage area 1522 at least in part in response to receiving the memory access command from processor 1510, according to an embodiment. Of course, computing platform 1500 is merely one example of a system implemented in accordance with claimed subject matter, and the scope of claimed subject matter is not limited in these respects.

In one implementation, a method is provided. The method includes forming one or more recessed word-line contact regions in a first material of a phase change memory array, including performing a pitch multiplication operation.

Forming the recessed word-line contact regions can include forming buried n+ silicon word-line contact regions. Performing the pitch multiplication operation can include performing a self-aligned double-patterning operation on a stack of semiconductor layers including the first material over a substrate material, where the first material has an opposite conductivity type from the substrate material. The stack can also include a second material over the first material, where the second material has the conductivity type of the substrate material. Performing the pitch multiplication operation can provide a pattern interruption to create the recessed word-line contact regions. Providing the pattern interruption can create a space created between a pair of selector transistor that is greater than four times a width of one of the selector transistors in the phase change memory array. Performing the pitch multiplication operation can include defining a plurality of selector transistors each having an emitter and forming a phase change memory storage component over each emitter. Performing the pitch multiplication operation can include patterning one or more word-line strings in a stack of semiconductor layers, wherein the one or more word-line strings individually comprise a collector component comprising the substrate material, a base component, and an emitter component, and wherein the one or more word-line strings are oriented in a word-line direction. Performing the pitch multiplication operation can also include depositing a dielectric material over the one or more word-line strings. Performing the pitch multiplication operation can further include creating one or more pairs of lines over the dielectric material. Creating the one or more pairs of lines on the hard mask can include spacing two of the one or more pairs of lines apart by a distance of approximately greater than four times a width of a phase change memory storage component. Performing the pitch multiplication operation can also include forming sidewall spacers on the one or more pairs of lines. Performing the pitch multiplication operation can also include transferring a pattern of the sidewall spacers into the dielectric material. A pattern of the spacers can be transferred into the word-line strings. Forming the one or more recessed word-line contact regions in the first material can include forming trenches to insulate memory cells of the phase change memory array.

In another implementation, a memory device is provided. The memory device includes an array of memory cells each comprising a selector transistor. The array includes a word-line contact region in a base component in substantially direct contact with an electrically conductive interconnect electrically coupled to a word-line electrode. The word-line contact region is positioned between memory cells of the array.

The word-line contact region can have a width between a pair of selector transistors of the array that is greater than two times a width of each of the selector transistors. The width of the word-line contact region can be greater than four times the width of each of the selector transistors. The selector transistors can be regularly spaced along a word-line direction in accordance with a pitch multiplication pattern on either side of the word-line contact region, and the word-line contact region can represent an interruption of the pitch multiplication pattern. The selector transistors can be bipolar junction transistors. The base component can include a cathode component common to a plurality of the selector transistors. Each selector transistor can further include an emitter component electrically coupled to the base component, where the word-line contact region is recessed relative to the emitters. Each memory cell of the array of memory cells can include a phase change memory storage element electrically coupled between the emitter and a bit-line electrode. The word-line contact region can have a width between a pair of emitters greater than four times a width of the phase change memory storage component in each memory cell. The device can also include trenches having a depth to insulate select transistors of adjacent memory cells, where the word-line contact region has a depth substantially the same as the depth of the trenches.

In another implementation, a method is provided. The method includes energizing an electrode of a memory array to energize one or more selector transistors of the memory array by way of an electrically conductive interconnect in substantially direct contact with a recessed contact region formed in a cathode material of the one or more selector transistors, and to energize one or more phase change material storage cells electrically connected to the one or more selector transistors as part of a programming operation.

Emitters of the selector transistors can be regularly spaced along a word-line direction in accordance with a pitch multiplication pattern on either side of the recessed word-line contact region, and the word-line contact region can represent an interruption of the pitch multiplication pattern.

The term "computing platform" as used herein refers to a system and/or a device that includes the ability to process and/or store data in the form of signals and/or states. Thus, a computing platform, in this context, may comprise hardware, software, firmware or any combination thereof (other than software per se). Computing platform 1500, as depicted in FIG. 15, is merely one such example, and the scope of claimed subject matter is not limited to this particular example. For one or more embodiments, a computing platform may comprise any of a wide range of digital electronic devices, including, but not limited to, personal desktop or notebook computers, high-definition televisions, digital versatile disc (DVD) players and/or recorders, game consoles, satellite television receivers, cellular telephones, personal digital assistants, mobile audio and/or video playback and/or recording devices, or any combination of the above. Further, unless specifically stated otherwise, a process as described herein, with reference to flow diagrams and/or otherwise, may also be executed and/or controlled, in whole or in part, by a computing platform.

The terms, "and", "or", and "and/or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, and/or characteristic in the singular and/or may be used to describe a plurality or some other combination of features, structures and/or characteristics. Though, it should be noted that this is merely an illustrative example and claimed subject matter is not limited to this example.

In the preceding detailed description, numerous specific details have been set forth to provide a thorough understanding of claimed subject matter. However, it will be understood by those skilled in the art that claimed subject matter may be practiced without these specific details. In other instances, methods and/or apparatuses that would be known by one of ordinary skill have not been described in detail so as not to obscure claimed subject matter.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change, such as a transformation in magnetic orientation and/or a physical change or transformation in molecular structure, such as from crystalline to amorphous or vice-versa. In still other memory devices, a change in physical state may involve quantum mechanical phenomena, such as, superposition, entanglement, and/or the like, which may involve quantum bits (qubits), for example. The foregoing is not intended to be an exhaustive list of all examples in which a change in state form a binary one to a binary zero or vice-versa in a memory device may comprise a transformation, such as a physical transformation. Rather, the foregoing is intended as illustrative examples.

While there has been illustrated and/or described what are presently considered to be example features, it will be understood by those skilled in the art that various other modifications may be made and/or equivalents may be substituted, without departing from claimed subject matter. Additionally, many modifications may be made to adapt a particular situation to the teachings of claimed subject matter without departing from the central concept(s) described herein.

Therefore, it is intended that claimed subject matter not be limited to the particular examples disclosed, but that such claimed subject matter may also include all aspects falling within the scope of appended claims and/or equivalents thereof.

What is claimed is:

1. A memory device, comprising:
    an array of memory cells each comprising a selector transistor, the array including a word-line contact region in a base component in substantially direct contact with an electrically conductive interconnect electrically coupled to a word-line electrode, the word-line contact region positioned between memory cells of the array,
    wherein the word-line contact region has a width between a pair of selector transistors of the array that is greater than two times a width of each of the selector transistors.

2. The memory device of claim 1, further comprising trenches having a depth to insulate select transistors of adjacent memory cells, wherein the word-line contact region has a depth substantially the same as the depth of the trenches.

3. The memory device of claim 1, wherein the selector transistors comprise bipolar junction transistors.

4. A memory device, comprising:
    an array of memory cells each comprising a selector transistor, the array including a word-line contact region in a base component in substantially direct contact with an electrically conductive interconnect electrically coupled to a word-line electrode, the word-line contact region positioned between memory cells of the array,
    wherein the selector transistors are regularly spaced along a word-line direction in accordance with a pitch multiplication pattern on either side of the word-line contact region, and the word-line contact region represents an interruption of the pitch multiplication pattern.

5. The memory device of claim 4, wherein the word-line contact region has a width between a pair of selector transistors of the array that is greater than two times a width of each of the selector transistors.

6. The memory device of claim 5, wherein the width of the word-line contact region is greater than four times a width of each of the selector transistors.

7. A memory device, comprising:
   an array of memory cells each comprising a selector transistor, the array including a word-line contact region in a base component in substantially direct contact with an electrically conductive interconnect electrically coupled to a word-line electrode, the word-line contact region positioned between memory cells of the array,
   wherein the base component comprises a cathode component common to a plurality of the selector transistors.

8. A memory device, comprising:
   an array of memory cells each comprising a selector transistor, the array including a word-line contact region in a base component in substantially direct contact with an electrically conductive interconnect electrically coupled to a word-line electrode, the word-line contact region positioned between memory cells of the array,
   wherein each selector transistor further comprises an emitter component electrically coupled to the base component, wherein the word-line contact region is recessed relative to the emitters.

9. The memory device of claim 8, wherein each memory cell of the array of memory cells comprises a phase change memory storage element electrically coupled between the emitter and a bit-line electrode.

10. The memory device of claim 9, wherein the word-line contact region has a width between a pair of emitters greater than four times a width of the phase change memory storage component in each memory cell.

11. A method, comprising:
    energizing an electrode of a memory array to energize one or more selector transistors of the memory array by way of an electrically conductive interconnect in substantially direct contact with a recessed contact region formed in a cathode material of the one or more selector transistors, and to energize one or more phase change material storage cells electrically connected to the one or more selector transistors as part of a programming operation,
    wherein emitters of the selector transistors are regularly spaced along a word-line direction in accordance with a pitch multiplication pattern on either side of the recessed word-line contact region, and the word-line contact region represents an interruption of the pitch multiplication pattern.

12. The memory device of claim 11, wherein the word-line contact region has a width between a pair of selector transistors of the array that is greater than two times a width of each of the selector transistors.

* * * * *